US008963135B2

(12) United States Patent
Nikonov et al.

(10) Patent No.: US 8,963,135 B2
(45) Date of Patent: Feb. 24, 2015

(54) INTEGRATED CIRCUITS AND SYSTEMS AND METHODS FOR PRODUCING THE SAME

(71) Applicant: Intel Corporation, Santa Clara, CA (US)

(72) Inventors: Dmitri E. Nikonov, Beaverton, OR (US); Robert L. Sankman, Phoenix, AZ (US); Raseong Kim, Hillsboro, OR (US); Jin Pan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 13/690,407

(22) Filed: Nov. 30, 2012

(65) Prior Publication Data
US 2014/0152383 A1     Jun. 5, 2014

(51) Int. Cl.
| | | |
|---|---|---|
| H01L 29/08 | (2006.01) | |
| G06F 19/00 | (2011.01) | |
| H05K 3/46 | (2006.01) | |
| H05K 1/00 | (2006.01) | |
| H01L 51/00 | (2006.01) | |
| H01L 27/06 | (2006.01) | |
| H01L 27/28 | (2006.01) | |

(52) U.S. Cl.
CPC ............... *H05K 3/4644* (2013.01); *H05K 1/00* (2013.01); *H01L 51/00* (2013.01); *H01L 27/0688* (2013.01); *H01L 51/0004* (2013.01); *H01L 27/281* (2013.01)
USPC ............................................. 257/40; 700/98

(58) Field of Classification Search
CPC .................................................. B29C 67/0051
USPC .......................................................... 257/40
See application file for complete search history.

(56) References Cited

U.S. PATENT DOCUMENTS

| | | | |
|---|---|---|---|
| 2004/0207123 | A1 | 10/2004 | Patel et al. |
| 2005/0104027 | A1* | 5/2005 | Lazarev ........................ 252/62 |
| 2005/0251275 | A1 | 11/2005 | Carlson |
| 2005/0278056 | A1* | 12/2005 | Farnworth et al. ............ 700/118 |

(Continued)

FOREIGN PATENT DOCUMENTS

KR    10-2012-0121042 A    11/2012

OTHER PUBLICATIONS

Rao, "Flexible Electronics", Component Research, Intel Corporation, Sep. 12, 2012, 62 pages.

(Continued)

*Primary Examiner* — Lex Malsawma
(74) *Attorney, Agent, or Firm* — Grossman, Tucker, Perreault & Pfleger, PLLC

(57) ABSTRACT

Three dimensional integrated circuits including semiconductive organic materials are described. In some embodiments, the three dimensional integrated circuits include one or more electronic components that include a semiconductive region formed of one or more semiconductive organic materials. The electronic components of the three dimensional integrated circuits may also include insulating regions formed from organic insulating materials, and conductive regions form from conductive materials. The three dimensional integrated circuits may be formed by an additive manufacturing process such as three dimensional printing. Apparatus and methods for producing and testing three dimensional integrated circuits are also described.

9 Claims, 10 Drawing Sheets

(56) References Cited

U.S. PATENT DOCUMENTS

| | | | |
|---|---|---|---|
| 2006/0111807 A1* | 5/2006 | Gothait et al. | 700/119 |
| 2006/0231954 A1* | 10/2006 | Yan et al. | 257/744 |
| 2007/0123058 A1* | 5/2007 | Farnworth et al. | 438/780 |
| 2007/0124012 A1* | 5/2007 | Farnworth et al. | 700/118 |
| 2009/0294803 A1* | 12/2009 | Nuzzo et al. | 257/213 |
| 2010/0215856 A1 | 8/2010 | Kritchman | |
| 2010/0278952 A1 | 11/2010 | Silverbrook | |
| 2012/0224755 A1 | 9/2012 | Wu | |

OTHER PUBLICATIONS

"3D Printing", from Wikipedia, the free encyclopedia, downloaded from http://en.wikipedia.org/wiki/3D_printing.

International Search Report and Written Opinion received for PCT Application No. PCT/US2013/071138, mailed on Feb. 24, 2014, 20 pages.

* cited by examiner

INTEGRATED CIRCUITS AND SYSTEMS AND METHODS FOR PRODUCING THE SAME

FIELD

The present disclosure generally relates to integrated circuits and systems and methods for producing the same. In particular the present disclosure relates to three dimensional integrated circuits and systems and methods for producing the same.

BACKGROUND

Three dimensional integrated circuits ("3D ICs) are a highly anticipated emerging technology, and are viewed as having the potential to provide numerous benefits over traditional two dimensional integrated circuits. For example, 3D ICs may allow the production of circuits that include a larger number of components (e.g., transistors) in the same or smaller area as a two dimensional circuit. 3D ICs may also permit heterogenous integration, wherein different circuit layers are manufactured with different processes or even on different wafers—opening avenues to greater levels of circuit customization. Shorter interconnections between components may also be possible in 3D ICs, potentially reducing power consumption.

Several methods for manufacturing 3D ICs are known, including monolithic manufacturing, wafer-on-wafer manufacturing, die-on-wafer manufacturing, and die-on-die manufacturing. Monolithic fabrication of 3D ICs generally involves providing a first layer of circuitry and/or electronic components, depositing an inorganic material such as silicon on the first layer, and forming a second layer of circuitry/components on the first layer and/or electronic components by processing the deposited semiconductive material. In contrast, the wafer-on-wafer approach forms 3D ICs by building electronic components on two separate inorganic (e.g., silicon) semiconductor wafers, which are subsequently aligned, bonded, and diced to form 3D ICs. The wafer-on-die and die-on-die are similar to the wafer-on-wafer approach, except that one or both of the wafers is/are diced prior to bonding. For example, in the wafer-on-die approach, one of the wafers may be diced into singulated dice, which may be individually aligned and bonded onto die sites of the intact wafer. In the die-on-die approach, both wafers may be diced into singulated dice, which may then be aligned and bonded. In any of these approaches, the wafers and/or dies may be thinned before or after bonding.

Although existing processes for manufacturing 3D ICs are useful, they can present various challenges. For example, the quality of the deposited inorganic material produced during monolithic fabrication may be less than the quality of semiconductive materials provided in wafer form, which may result in reduced performance. The wafer-on-wafer, wafer-on-die, and die-on-die approaches may address this issue by forming electronic components in individual inorganic semiconductive wafers, e.g., silicon wafers. However, those processes may require expensive and time consuming alignment, bonding, and (optional) thinning operations. The number of layers that can be used to form 3D ICs with the wafer-on-wafer, wafer-on-die, and die-on-die approaches may also be limited. It may be necessary to perform such processes in a semiconductor fabrication facility in order to produce viable 3D ICs.

Thus, known processes for producing 3D ICs may entail a long design cycle, the production of expensive lithography masks, long wait times, and/or high fees for a foundry run. Such processes may therefore be economically undesirable when relatively few copies of a 3D IC are to be produced, as may be the case during the design, prototype, and test phases of circuit development.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Figure 1A:
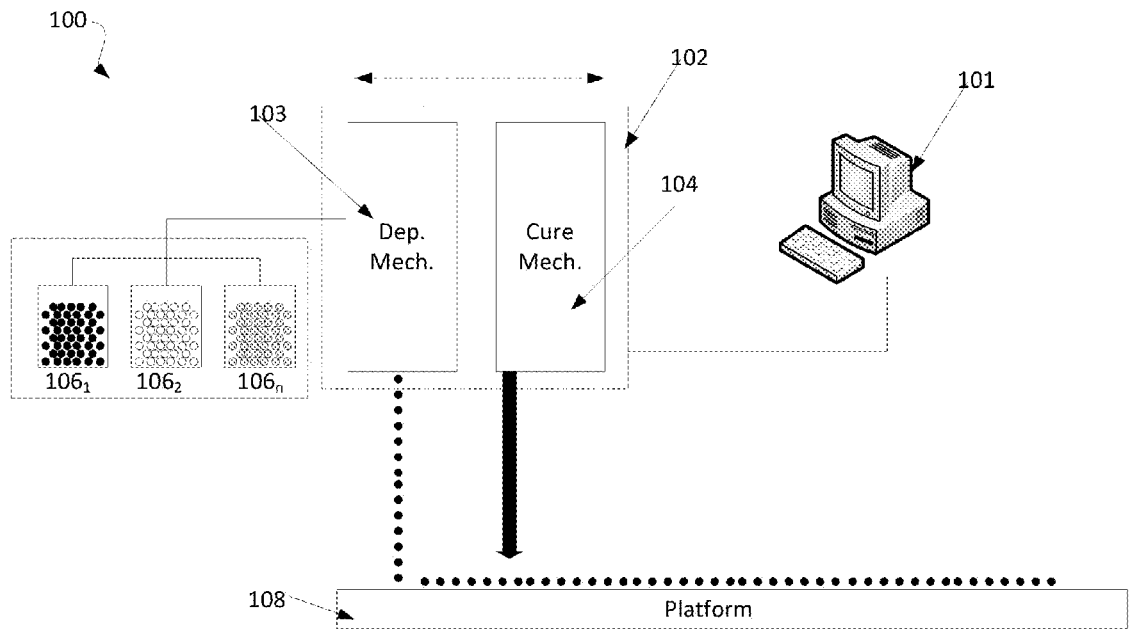
FIGS. 1A and 1B depict an exemplary three dimensional printing apparatus for manufacturing three dimensional integrated circuits consistent with the present disclosure.

Although the following detailed description will proceed with reference being made to illustrative embodiments, many alternatives, modifications, and variations thereof will be apparent to those skilled in the art.

DETAILED DESCRIPTION

While the present disclosure is described herein with reference to illustrative embodiments for particular applications, it should be understood that such embodiments are exemplary only and that the invention as defined by the appended claims is not limited thereto. Those skilled in the relevant art(s) with access to the teachings provided herein will recognize additional modifications, applications, and embodiments within the scope of this disclosure, and additional fields in which embodiments of the present disclosure would be of utility.

For the purpose of the present disclosure, the term "print head," "print," and the like mean any device or technique that deposits or creates material on a surface in a controlled manner.

As used herein, the term "electronic component" refers to any discrete device and/or physical entity in an electronic system that is used to affect electrons or their associated fields. Electronic components include but are not limited to active and passive components. Non-limiting examples of active electronic components include diodes, transistors, integrated circuits, and optoelectronic devices. Exemplary passive components include but are not limited to resistors, capacitors, inductive devices, transducers, and antennas.

The terms "three dimensional integrated circuit" and "3D IC" are interchangeably used herein to refer to a circuit that includes a plurality of electronic components, wherein at least a portion of such components are horizontally integrated and vertically integrated. "Horizontally integrated" when used in connection with an electronic component means that the electronic component is located in a first plane, and is electrically connected to at least one other electronic component that is also located in the first plane. The term "vertically integrated" when used in connection with an electronic component means that the electronic component is located in a first plane, and is electrically connected to at least one other electronic component that is located in a second plane that is above or below the first plane.

As noted in the background, current methods for manufacturing 3D ICs rely on the processing of one or more wafers of inorganic semiconductive materials such as silicon, germanium, gallium arsenide, silicon carbide, combinations thereof, and the like. Although such semiconductors may be used in their pure form (i.e., as intrinsic semiconductors), one or more impurities ("dopants") may be added to them to change their electrical characteristics, as is well understood in the art. For example crystalline silicon may be doped with boron, aluminum, gallium, and other group 13 (IUPAC) elements, which function as acceptors. Alternatively, crystalline silicon may be doped with phosphorous, nitrogen, arsenic, antimony, and other group 15 (IUPAC) elements, which function as donors. A semiconductor that is doped or otherwise processed to contain excess acceptors is conventionally referred to a "p-type semiconductor." In contrast, a semiconductor that is doped or otherwise processed to contain excess electrons is conventionally referred to as an "n-type" semiconductor.

While an enormous variety of electronic components and circuits may be manufactured using traditional inorganic semiconductors such as silicon, such materials can be difficult and expensive to process. Indeed to make operational electronic components out of such materials, it may be necessary to process such materials in a semiconductor fabrication facility, which can add significant time and expense to the development of a 3D IC. In addition, the use of traditional inorganic semiconductor materials to form 3D ICs is practically difficult, for the reasons explained in the background.

With the foregoing in mind, the present disclosure generally relates to three dimensional integrated circuits (3D ICs), as well as systems and methods for making the same. The disclosed 3D ICs may include, for example, electronic components (e.g., diodes, transistors, integrated circuits, optoelectronic devices, combinations thereof, and the like) which may be formed from materials that may be selectively deposited via an additive manufacturing process, e.g., with a three dimensional printer. Such materials may include, for example, organic insulators, organic semiconductors, and organic or metallic conductors. Such materials may be used in place of the insulating, semiconducting, and/or conducting materials that might otherwise be used to form various portions of an electronic component in a traditional semiconductor manufacturing process. For reasons that will become apparent, the 3D ICs, systems and methods described herein may provide a mechanism for circuit designers to produce prototype versions of 3D IC designs "on demand," i.e., without the need or inconvenience of a semiconductor facility, even if the design contains hundreds, thousands, tens of thousands, hundreds of thousands, or even millions of electronic components.

Any suitable type of organic insulator may be used in the electronic components, systems, and methods of the present disclosure, so long as they may be selectively deposited using an additive manufacturing process. Examples of such organic insulators that may be used include but are not limited to polypropylene, polystyrene, polycarbonate, fluorinated ethylene-propylene copolymer, polyethylene terephthalate, combinations thereof, and the like. Without limitation, polyethylene is preferable used as an organic insulator in the electronic components, systems and methods described herein.

Similarly, any type of organic semiconductor may be used in the electronic components, systems, and methods described herein, so long as they may be selectively deposited using an additive manufacturing process. As used herein, the terms "organic semiconductor" and "semiconductive organic material" are interchangeably used to mean an organic or organometallic material that exhibits semiconductive properties. Such materials include but are not limited to single molecule, short chain polymers (e.g., oligomers), and polymers with semiconductive polymers. Like purely inorganic semiconductors such as silicon and germanium, organic semiconductors may be doped with impurities or otherwise processed to contain excess acceptors (p-type) or donors (n-type). As such, the organic semiconductors described herein may be used to replace undoped, p-type, and/or n-type inorganic semiconductors that may be used to form various portions of an electronic component in a traditional semiconductor manufacturing process.

As non-limiting examples of specific organic semiconductors that may be used in accordance with the present disclosure, mention is made of the materials listed in table 1 below.

TABLE 1

Exemplary Organic Semiconductors

| Semiconductor | Chemical Formula/Name | Type | Mobility ($cm^2V^{-1}s^{-1}$) |
|---|---|---|---|
| Pentacene | $C_{22}H_{14}$ | P | 0.6-5.5 |
| Rubrene | $C_{42}H_{28}$ | P | Up to 40 |
| F16CuPc | Hexadecafluorocopper-phthalocyanine | N | 0.02 |
| PTCDA | Perylene-tetracarboxylic dianhydride | N | 0.0001 |
| NTCDA | Napthalene-tetracarboxylic dianhydride | N | 0.003 |
| — | Copper phthalocyanine | P | — |
| A-6T | α-sexithiophene | P | 0.02 |
| TIPS Pentacene | 6,13-Bis(tri-isopropylsilyl-ethynyl) pentacene | P | 0.4 |
| PTCDI-$C_{13}H_{27}$ | N,N' - ditridecylperylene-3,4,9,10-tetracarboxylic diimide | N | 0.6 |
| α-NPD | 4,4'-bis[N-(1-Napthyl)-N-phenyl-amino]-biphenyl | Hole transport layer | — |
| NPB | α-napthylphenylbiphenyl diamine | Hole transport layer | — |
| Polyacetylene (P doped) | $(C_2H_2)_n$ + $Br_2$, $I_2$, $AsF_5$, etc. | P | — |
| Polyacetylene (N doped) | $(C_2H_2)_n$ + Li, Na, K, Rb, other alkali metals, etc. | N | — |

Of course, such organic semiconductors are exemplary only, and others may be used in accordance with the present disclosure. Without limitation, the electronic components, systems and methods of the present disclosure preferably use PTCDI-$C_{13}H_{27}$ and/or n-doped polyacetylene as n-type organic semiconductors, and pentacene and/or p-doped polyacetylene as p-type organic semiconductors.

The electronic components, systems and methods described herein may also use any suitable type of conductive material, so long as such material may be selectively deposited using an additive manufacturing process. Such materials include but are not limited to conductive polymers and conductive inorganic materials such as metals. As non-limiting examples of conductive materials that may be used in accordance with the present disclosure, mention is made of metals such as copper, aluminum, silver, gold, and the like, conductive inorganic materials such as indium tin oxide, conductive organic materials such as rubrene, polyaniline, undoped polyacetylene $(C_2H_2)_n$, poly (3,4-ethylenedioxythiphene) poly (styrenesulfonate) (PEDOT; PSS), tetrathiafulvalene-tetracyanoquinomethane (TTF-TCNQ), polypyrrole, and polythiophene, combinations thereof, and the like. It is noted that while rubrene is a semiconducting material, it exhibits very high mobility of electrons and therefore can be used for interconnecting wire in instances where a metal would traditionally be used. Without limitation, the electronic components, systems and methods of the present disclosure preferably use copper, aluminum and/or rubrene as conductive materials.

As used herein, the phrase "may be selectively deposited using an additive manufacturing process" when used in conjunction with a material (or material type) means that the material (or material type) may be deposited or otherwise formed on a support in a controlled manner at a desired location using any of a wide variety of known three dimensional (3D) printing techniques. Non-limiting examples of such techniques include fused deposition modeling (FDM), stereolithography (SLA), and granular materials binding (e.g., selective laser sintering (SLS)). The nature and operation of each of these processes are well understood and therefore are only briefly discussed herein.

In general, fused deposition modeling involves the use of a heated extrusion nozzle to deposit molten extrudate on substrate or other support. The extrusion nozzle may be moved in one to three dimensions so as to permit the deposition of molten extrudate at desired locations on a support. Subsequent to deposition, the molten extrudate may be cured (e.g., hardened) to form a solid layer. In this regard, the extrudate may be self curing, or it may cure with the application of heat, light, or another external influence. Fused deposition modeling may be used to selectively deposit a wide range of organic insulating, organic semiconducting, and conductive materials.

SLA generally involves the use of photopolymerization to produce a solid layer from a liquid photopolymer. In one example of a SLA process, a support is submerged under the surface of a liquid photopolymer. All or a portion of the photopolymer above the surface of the platform may then be exposed to light of an appropriate wavelength, e.g., ultraviolet light. The exposed liquid photopolymer hardens, forming a layer or other feature. The support may then be repositioned such that additional liquid photopolymer is present on or above its surface. All or a portion of the additional photopolymer may be exposed to ultraviolet light and hard, forming another layer. The process continues until a desired shape is formed. Of course, the liquid photopolymer may be disposed on the support by a process other than submersion. For example, liquid photopolymer may be brushed, rolled, or otherwise provided on the surface of a support, after which it may be exposed to light of a suitable wavelength, as discussed above.

Granular material sintering processes generally involve the fusion (sintering) of particulate (e.g., granular) materials with an external source of heat, such as a laser, heated air, infrared energy, etc. The particulate materials used may be organic (e.g., organic insulators, organic semiconductors, organic conductors), organometallic, or inorganic (e.g., metals such as CU, Al. etc.). Such particles may be provided on a support in any suitable manner. In some embodiments, particles are provided by spreading a layer of particles in a binder onto a support, e.g., using an ink jet printing system. As each layer is provided, heat and/or light may be applied to fuse the particles and form a solid layer. The particle provision and curing process iteratively repeats, producing multiple layers and/or features formed of fused particles until a final shape is achieved. Exemplary granular material sintering processes include selective laser sintering (SLS). In SLS, a laser is used to fuse small particles (e.g., of organic insulating, organic semiconductive, and/or conductive materials) into a mass with a desired three dimensional shape.

One aspect of the present disclosure relates to a three dimensional ("3D") printing apparatus for producing electronic components and 3D ICs. In general, the 3D printing apparatus described herein may function to selectively deposit or otherwise form electrically insulating (dielectric), electrically conductive, and/or semiconductive regions of electronic components and 3D IC's from organic insulating materials, semiconductive organic materials, and conductive materials, such as those previously described. The location at which such materials are deposited/formed may be controlled in three dimensions, based on an electronic representation (i.e., a digital computer model) of the electronic component and/or 3D IC to be formed. As a result, the 3D printing apparatus described herein may "build up" or "print" electronic components and/or 3D ICs, as will be discussed in detail below.

Figure 1B:
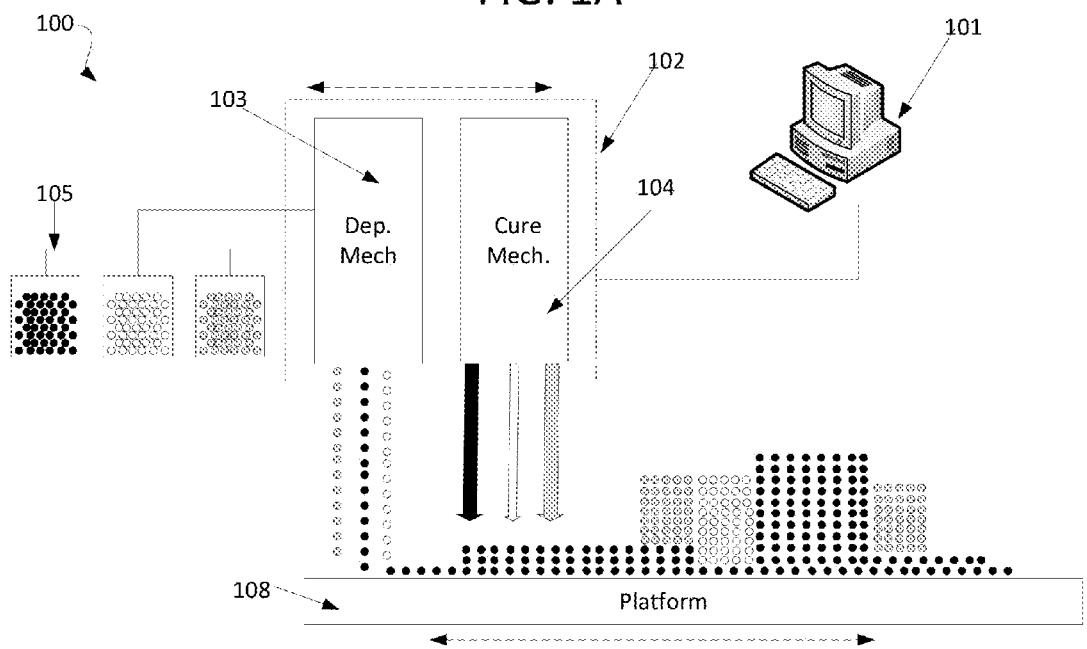

In this regard, reference is made to FIGS. 1A and 1B, which depicts an exemplary 3D printing apparatus consistent with the present disclosure. As shown, 3D printing apparatus 100 includes controller 101 and print head 102. Print head 102 includes deposition mechanism 103 and curing mechanism 104. 3D printing apparatus 100 further includes material supply 105, which in the illustrated embodiment is coupled to deposition mechanism 103 to supply one or more materials $106_1, 106_2, 106_n$ being an integer greater than or equal to 3) for deposition.

Materials $106_1, 106_2, 106_n$ may be one or more organic insulating materials, organic semiconducting materials, and/or conductive materials (e.g., organic conducting materials, indium tin oxide, metals, etc.). For ease of understanding, material store 105 is illustrated in FIGS. 1A and 1B as including three materials, i.e., $106_1, 106_2,$ and $106_n$. Materials $106_1, 106_2,$ and $106_n$ are described herein as generally correlating to organic insulating, organic semiconducting, and conductive materials, respectively. As a practical matter however, the number and type of materials in materials store 105 is not limited, and may correlate to the number and type of materials that print head 102 is capable of selectively depositing. Thus, any suitable number of materials may be stored and provided by materials store 105. Moreover, materials $106_1, 106_2$ and $106_n$ may be any desired material.

For the sake of illustration, 3D printing apparatus 100 is depicted in FIGS. 1A and 1B as including a single print head 102, which includes a single deposition mechanism 103 and a single curing mechanism 104. It should be understood that the illustrated configuration is exemplary only and that any number of print heads may be used. Moreover, each print head 102 may include any suitable number of deposition mechanisms 103 and/or curing mechanisms 104. Indeed, the present disclosure envisions 3D printing apparatus that include a plurality of print heads, each or which include one or more deposition and/or curing mechanisms. For example, 3D printing apparatus 100 may include 2, 3, 4, 5, 10, 15, 20, 50, etc. or more print heads, each or which includes one or more deposition mechanisms and/or curing mechanisms.

In some embodiments, the number of print heads 102 in 3D printing apparatus 100 corresponds to the number of different materials that 3D printing apparatus 100 is capable of depositing (e.g., the number of materials in material store 105). In other embodiments, 3D printing apparatus 100 includes a single print head 102 that includes a plurality of deposition mechanisms 103 and curing mechanisms 104. Thus, 3D printing apparatus 100 may include a dedicated print head and/or deposition/curing mechanism for each type of material that may be deposited by 3D printing apparatus 100. In some embodiments, 3D printing apparatus 100 includes at least one print head for selectively depositing organic insulating material, at least one print head 102 for selectively depositing semiconductive organic material, and at least one print head for selectively depositing conductive material.

In additional embodiments 3D printing apparatus 100 may include a single print head 102 that includes at least one deposition mechanism 103 for selectively depositing organic insulating material, at least one deposition mechanism 103 for selectively depositing semiconductive organic material, at least one deposition mechanism 103 for selectively depositing conductive material, and corresponding curing mechanisms 104. In such embodiments, the deposition mechanisms and curing mechanism for the organic insulating material, semiconductive organic material, and conductive material may be the same or different. For example, the deposition and curing mechanism for organic insulating material and semiconductive organic material may selectively deposit such materials using fused deposition modeling, whereas the deposition and curing mechanism for the conductive material may deposit such material using granular materials binding, e.g., selective laser sintering or direct metal laser sintering. Without limitation, print head 102 is preferably configured to deposit organic insulating material, semiconductive organic material, and conductive material using fused deposition modeling.

In some embodiments, deposition mechanism 103 is configured in the form of a plurality of nozzles, such as may be found in the print head of an ink-jet printer. In such instances, all or a portion of the plurality of nozzles may be configured to deposit the same or different materials. For example, the plurality of nozzles may be divided into a first group of nozzles for depositing insulating material, a second group of nozzles for depositing semiconducting material, and a third group of nozzles for depositing conductive material. In other embodiments, the plurality of nozzles is divided into a plurality of groups, wherein the number of groups corresponds to the number of materials in materials store 105. In either case, each group of nozzles may be associated and supplied with a corresponding material in materials store 105. In such instances, print head 102 may be capable of depositing or otherwise forming multiple materials at the same time.

Alternatively, the plurality of nozzles may be configured such that all of the nozzles deposit a single material at a time. In such instances, print head 102 may deposit multiple materials by changing the type of material that is fed to the plurality of nozzles in deposition mechanism 103.

Curing mechanism 104 may be configured to cure material deposited by deposition mechanism 103 in any suitable manner. As used herein, the term "cure" when used in conjunction with a layer refers to any process that results in the production of a solid layer from a deposited material. For example, a liquid material may cure by evaporation of a solvent, by polymerization of components within the liquid (e.g., via photopolymerization), etc. Similarly, a layer of powder may be cured, or sintered, into a layer by the application of light and/or heat. In instances where print head 102 includes one or more deposition mechanisms 103 that can deposit multiple materials, curing mechanism 104 may be configured such that it is capable of curing each material that may be deposited by deposition mechanism 103. For example, print head 102 may include two or more deposition mechanisms, each of which is to deposit a different material. In such instances, print head 102 may include a multiple curing mechanisms 104, one for each deposition mechanism 103, wherein each curing mechanism 104 is configured to cure the material deposited by its corresponding deposition mechanism. Alternatively, print head 102 may include a single curing mechanism 104, which may be configured such that it can cure all of the diverse materials deposited by the deposition mechanism(s) 103 in print head 102.

As may be appreciated, the nature and configuration of curing mechanism 104 may depend on the nature of the materials that are deposited by deposition mechanism 103. As noted previously, deposition mechanism 103 and/or print head 102 may be capable of depositing multiple diverse materials, often in close proximity. By way of example, deposition mechanism 103 may deposit a single layer of material that includes one, two, three, or more materials. In such instances, curing mechanism 104 may be the same or different for each deposited material. For example, if a deposition mechanism 103 is capable of printing organic insulating materials, organic semiconducting materials, and conducting materials, such materials may be cured with a first curing mechanism, a second curing mechanism, and a third curing mechanism, respectively. In such instances, the first, second and third curing mechanisms may be the same or different.

Controller 101 may be any suitable controller for directing the operations of 3D printing apparatus 100. For example, controller 101 may be a desktop computer, laptop computer, tablet personal computer, mobile device, combinations thereof, and the like. Without limitation, controller 101 is preferable a desktop computer.

Regardless of its form, controller 101 may include a processor and a memory (both not shown) having 3D dimensional printing instructions stored thereon. The instructions when executed by the processor may cause controller 101 to process a computer model of a circuit component and/or 3D IC into a plurality of cross sections, i.e., layers. If a layer includes multiple different materials, controller 101 may further process each layer into voxels that define regions of differing materials. Controller 101 may then cause print head 102 (or, more specifically, deposition mechanism 103 and curing mechanism 104) to selectively deposit or otherwise form layers and/or voxels of materials (e.g., $106_1$, $106_2$, $106_n$) in appropriate locations on a support. Over time, print head 102 deposits/forms each layer/voxel of the processed model, ultimately producing a real world (physical) copy of the computer model of the circuit component and/or 3D IC.

A non-limiting conceptual example of this process is depicted in FIGS. 1A and 1B, which illustrate 3D printing apparatus 100 as it deposits multiple layers of materials provided by material supply 105 on platform 108. In this example, controller 101 may process a computer model of an electronic component or 3D IC into a plurality of layers, in this case layers L1-L6. Depending on the configuration of the modeled component or 3D IC, any or all the layers may include regions (voxels) of insulating material (e.g., corresponding to insulating regions of the component to be formed), regions of semiconductive material (corresponding to semiconductive regions of the component to be formed), regions of conductive material (corresponding to conductive regions of the component to be formed), and combinations thereof. This concept is illustrated in FIG. 1B, wherein layers L1 and L6 are formed of single materials, and layers L2-L5 are formed of multiple materials.

After processing the model, controller 101 may cause deposition mechanism 103 of print head 102 to selectively deposit layer L1 on platform 108 using materials supplied by materials store 105. In this example, layer L1 in the model is uniformly made of a single organic insulating material, illustrated in this case as material $106_1$. Accordingly, controller 101 may cause print head 102 to selectively deposit and cure a layer of material $106_1$ on platform 108, thus forming a physical copy of the modeled layer L1 on platform 108.

Once layer L1 is formed, controller 101 may then cause print head 102 to selectively deposit layer L2 of the processed model. As shown in FIG. 1B, layer L2 in the model includes regions (voxels) of organic insulating material, semiconductive organic material, and conductive material, which in this case correspond to materials $106_1$, $106_2$, and $106_3$, respectively. Accordingly, controller 101 may cause print head 102 to selectively deposit/form the appropriate material at the correct location on the surface of layer L1, thereby forming a physical copy of layer L2 in the model. Controller 101 may continue this process, causing print head 102 to iteratively form physical copies of the remaining layers in the model until a physical reproduction of the modeled electronic component and/or 3D IC is formed.

As noted previously, print head 102 may be configured in any manner that is suitable to deposit and/or otherwise form one or more layers of the same of varying substances. For example, print head 102 may be configured to deposit material layers and/or voxels using one or a combination of 3D printing processes, such as fused deposition modeling (FDM), stereolithography (SLA), and granular material bonding, as discussed above.

In some embodiments, print head 102 is configured to deposit all or a portion of each layer of a modeled electronic component or 3D IC using fused deposition modeling. In such instances, deposition mechanism 103 may include at least one extrusion head that is capable of depositing a molten extrudate of materials $106_1$, $106_2$, $106_n$, or a combination thereof onto a surface of a support, such as platform 108. To facilitate the deposition of the molten extrudate as a layer, print head 102, deposition mechanism 103, and/or platform 108 may be horizontally and/or vertically moveable, as indicated by the hashed double arrows in FIGS. 1A and 1B. Subsequent to deposition, the extrudate may be cured, e.g., with curing mechanism 104, so as to form a solid layer. Subsequent layers may be deposited on previously deposited layers in much the same manner, until the desired structure is achieved.

Print head 102 may be configured to deposit or otherwise form materials in materials store 105 into features of a desired minimum size. In this regard, the size and/or configuration of various components of print head 102 may be adjusted to form layers and/or features of a desired minimum size/thickness. For example, where deposition mechanism 103 includes a plurality of nozzles, such nozzles may be sized and/or shaped to output materials in materials store 105 at a desired size. In some instances, the diameter of the output of each of the plurality of nozzles may range from about 1 to about 100 microns, such as about 5 to about 50 microns, or even about 10 to about 20 microns. Without limitation, the output diameter of each nozzle is about 10 microns. In such instances, print head 102 may be capable of depositing or otherwise forming layers/features that have a minimum size/thickness correlating to the diameter of the output of the plurality of nozzles. For example, nozzles with an output diameter of 1-10 microns may be capable of forming layers and features of having a minimum thickness/size of 1-10 microns.

Of course, the foregoing size ranges are exemplary only, and print head 102 may be configured to produce layers and/or features of any desired minimum thickness/size. For example, print head 102 may be configured to produce layers/features with a minimum thickness ranging from about 500 nanometers (nm) to about 50 microns, such as about 750 nm to about 25 microns, about 900 nm to about 15 microns, about 1 micron to about 10 microns, or even about 5 microns. Without limitation, the minimum layer/feature thickness/size is as small as possible. In some embodiments, print head 102 is configured in some embodiments to produce layers and/or features with a minimum thickness/size of 10 microns.

Likewise, print head 102 may be configured to deposit and/or otherwise form layers/features with a desired minimum horizontal resolution. That is, print head 102 may be configured such that it can deposit features/layers apart from one another by a desired minimum distance. In some embodiments, print head 102 is configured such that it is capable of depositing layers/features with a minimum horizontal resolution ranging from about 500 nm to about 100 microns, such as about 750 nm to about 50 microns, about 1 micron to about 40 microns, about 5 microns to about 25 microns, about 5 microns to about 15 microns, or even about 10 microns. In some embodiments, print head 102 can deposit or otherwise form features/layers with a minimum horizontal resolution of about 40 microns. Without limitation, minimum horizontal resolution is preferably as small as possible.

With the foregoing in mind, print head 102 may be capable of depositing or otherwise forming electronic components having a minimum area of $F^2$ multiplied by a number between 1 and 12, where F is the minimum size of the features that may be produced by print head 102. Accordingly, if print head 102 is configured to form features with a minimum thickness/size of 10 microns, it can also form electronic components with minimum area of 100 square microns ($F^2=10$ μm$^2$). If print head 102 has a minimum feature size of 10 microns and a minimum horizontal resolution of 40 microns, it may therefore deposit or otherwise form a 1 cm$^3$ 3D IC that contains approximately 100 million electronic components.

Another aspect of the present disclosure relates to methods of producing electronic components and/or 3D IC's using an additive manufacturing process, such a 3D printing. In this regard, reference is made to FIG. 2, which is a flow chart of an exemplary method 200 consistent with the present disclosure. As shown, method 200 begins at block 201. In some instances, a processed digital model of an electronic component and/or 3D IC may have been previously provided, in which case the method may proceed directly to block 203. Otherwise, the method proceeds from block 201 to optional block 202.

At optional block 202, a digital model of an electronic component and/or 3D ICs is processed into a plurality of cross-sections, i.e., layers. If a layer of the processed digital model includes regions of multiple materials (e.g., insulating, conducting, and/or semiconductive materials), the layer may be further processed into voxels, with each voxel corresponding to an appropriate material type. As noted previously, the model may be provided in any suitable format, and may be processed by any suitable processor. In some embodiments, the digital model is processed by a processor of a control device, such as controller 101 of FIGS. 1A and B.

In any case, the plurality of layers and/or voxels may be sized and spaced such that they are capable of being reproduced by a print head of a 3D printer. That is, the dimensions of the layers/voxels may be set such they are greater than or equal to the minimum thickness/feature size that the print head of a 3D printer can produce. Likewise, the spacing of the layers/features in the processed model may be set such they are greater than or equal to the minimum horizontal resolution of the print heat of a 3D printer. Accordingly, if a 3D Printer is capable of forming layers/features with a minimum thickness of 10 microns at a horizontal resolution of 40 microns, each layer/voxel of the processed model, may be sized accordingly. That is, the layers of the processed model may be at least about 10 microns thick, and the features of the processed model may be spaced at least about 40 microns apart.

Once a processed digital model of an electronic component is available, the method may proceed to blocks 203 and 204, wherein the first layer of the processed model may be physically reproduced with a 3D Printer. For example, a controller of a 3D printer may send a signal to a print head of a 3D printer containing information regarding the first layer of the processed digital model. Such information may include the size of the layer, the materials that are to form the layer, the relative position of those materials, the thickness of the layer, etc. In response to this signal, the print head of the 3D printer may produce a physical copy of the first layer on a support, e.g., by selectively depositing the appropriate materials at the appropriate locations with an appropriate deposition mechanism. Synchronously or asynchronously with the selective deposition, the deposited materials may be cured with an appropriate curing mechanism, as shown in block 204.

Once the first layer is complete, the process may continue to block 205, wherein a determination is made as to whether there are additional layers in the processed digital model that require production. If so, the method loops back to blocks 203 and 204, wherein the next layer in the processed model is physically produced by the 3D printer. Blocks 203-205 iteratively repeat until no further layers in the processed digital model remain. The method then proceeds to block 206, whereupon the method ends.

As may be clear from the foregoing description, the systems and methods of the present disclosure may enable circuit designers to build electronic components and 3D ICs on a layer by layer basis. As layers are deposited, subcomponents of electronic components (e.g., gates, contacts, insulating regions, semiconductive regions, sources, drains, bodies, etc.) may be formed, based on the description of such components in a digital model of the component/IC in which they are contained.

Figure 2:
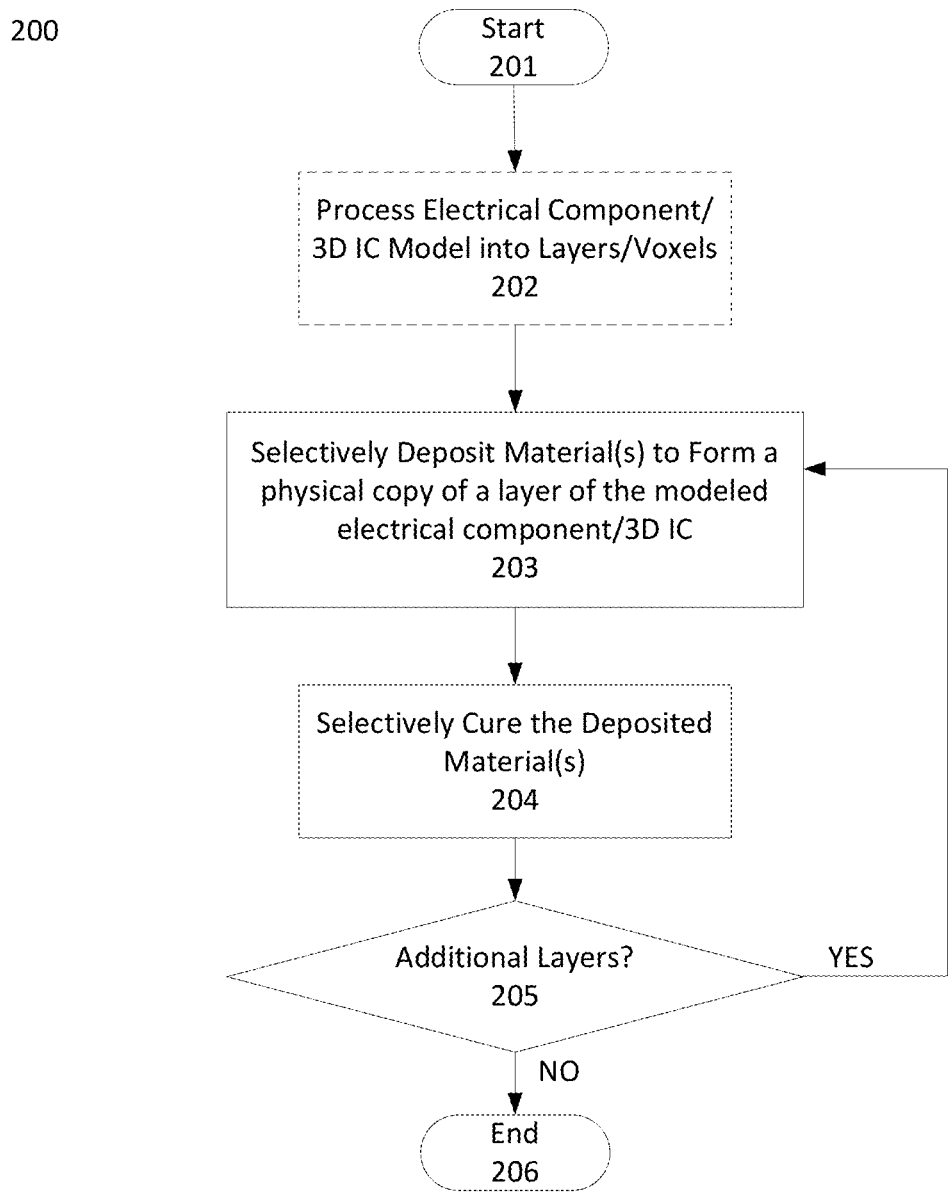
FIG. 2 is a flow chart of an exemplary method of manufacturing three dimensional integrated circuits consistent with the present disclosure.

For the sake of clarity and understanding, the present disclosure will now proceed to describe a number of examples in which electronic components and/or 3D IC's are produced using an additive manufacturing apparatus and process, such as those shown in FIGS. 1A, 1B, and 2. Specifically, the present disclosure will describe the formation of a thin film field effect transistor (FET), two different bipolar junction transistors (BJTs), and 3D IC's including such components. It should be understood that such components and 3D ICs are exemplary only, and merely represent a few of the possible electronic components and 3D IC's that may be produced in accordance with the present disclosure. Indeed, the systems and methods of the present disclosure may be used to produce any type of electronic component and any 3D IC design containing such components. For example, the systems and methods described herein may be used to form any type of active or passive electronic components, as well as 3D ICs containing such components.

Figure 3A:
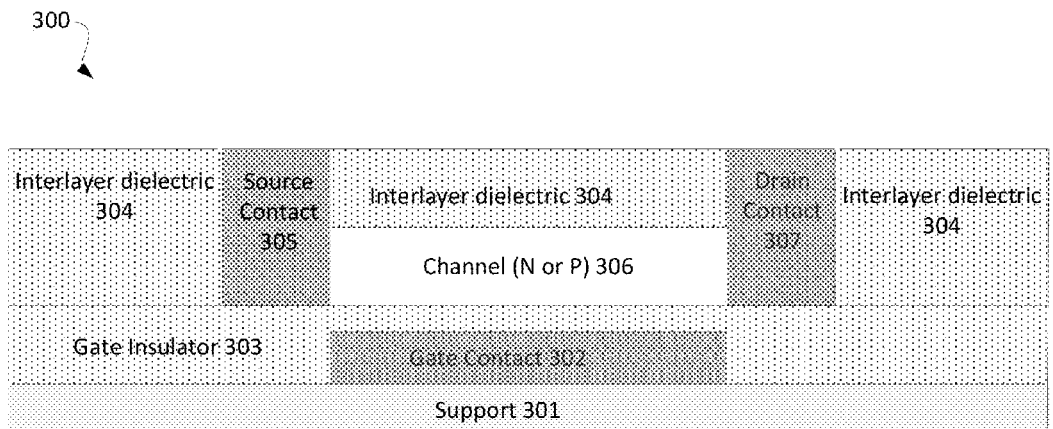
FIGS. 3A and 3B depict an exemplary cross-sectional model of a thin film field effect transistor consistent with the present disclosure, in model form and after processing.

With the foregoing in mind, FIG. 3A is a cross-sectional model illustrating the structure of exemplary thin film field effect transistor (FET) consistent with the present disclosure. As shown, model 300 of the FET includes support 301. Gate contact 302 is present on the upper surface of support 301. Gate insulator 303 is present above and to the sides of gate contact 302. Present on the upper surface of gate insulator 303 is interlayer dielectric 304, source contact 305, channel 306, and drain contact 307. Interlayer dielectric 304 is also present above channel 306 and between source contact 305 and drain contact 307. The operation of a FET and the functions of the various components illustrated in FIG. 3A are well understood in the art, and thus are not described. It is noted that the configuration shown in model 300 is merely exemplary only, and depicts a simplified FET structure for the sake of clarity and ease of understanding.

Model 300 may be in the form of a computer or other electronic file, and may include information regarding the properties and/or materials that form the various components of the modeled FET. For example, model 300 may indicate that gate contact 302, source contact 305, and drain contact 307 are conductive and thus, formed from one or more conductive materials such as the conductive materials previously described. In some embodiments, model 300 indicates that gate contact 302, source contact 305, and drain contact 307 are formed from one or more of copper, aluminum, and rubrene. Without limitation, such components are preferably formed from rubrene. Of course, such components need not be formed of the same conductive material, and can in fact be made from different conductive materials, as desired.

Similarly, model 300 may indicate that support 301, gate insulator 303, and interlayer dielectric 304 are non-conductive and thus, formed from one or more organic insulating materials, such as those previously described. For example, model 300 may indicate that support 301, gate insulator 303 and interlayer dielectric 304 are formed from polyethylene or another non-conductive material. Without limitation, such components are preferably formed from polyethylene. Of course, such components need not be form of the same non-conductive material, and in fact can be made from different non-conductive materials, as desired.

Still further, model 300 may indicate that channel 306 is semi-conductive and thus, is formed from one or more semi-conductive organic materials, such as those previously described. For example, model 300 may indicate that channel 306 is formed from an n-type or p-type organic semiconductor, such as p or n doped polyacetylene, p or n doped pentacene, or another p or n doped organic semiconductor. Without limitation, channel 306 is preferably formed from p or n doped polyacetylene or p or n doped pentacene.

Figure 3B:
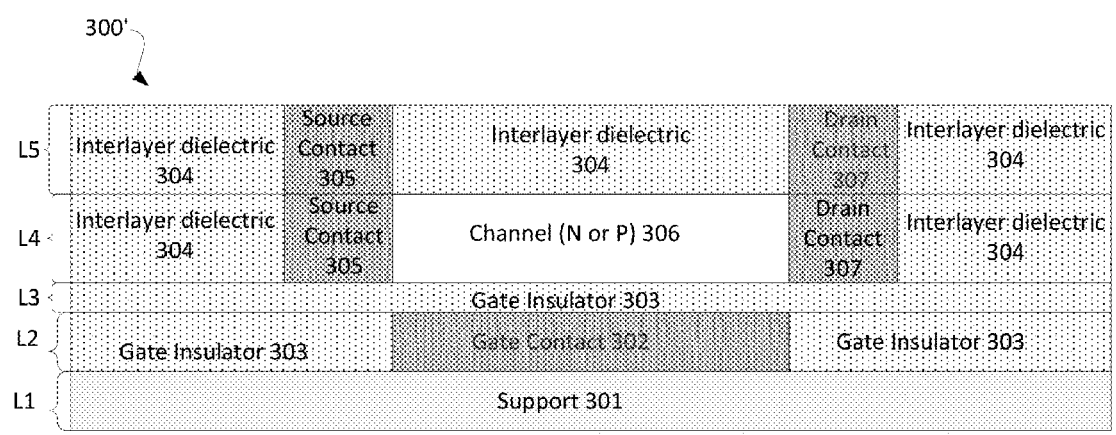

Consistent with the foregoing description, model 300 may be processed by a processor (e.g., of controller 101 of FIGS. 1A and 1B) into a plurality of cross-sections, or layers. In instances where a layer contains multiple materials, such layer may be further processed into voxels, with each voxel defining a region associated with one of the materials of a layer. This concept is illustrated in FIG. 3B, wherein processed model 300' is shown as processed into five layers, i.e., layers L1-L5. Layers L2, L4, and L5 include multiple materials (gate insulator/gate contact; interlayer dielectric/source contact/channel/drain contact; interlayer dielectric/source contact/interlayer dielectric/drain contact/interlayer dielectric), and thus have been further processed into voxels, which are generally illustrated by the lines delineating regions of each differing material in these layers.

It is noted that the number of layers and voxels in FIG. 3B is exemplary only, and that model 300 may be processed into more or less layers/voxels, as desired. The use of more or less layers/voxels may impact various aspects of the physical reproduction of model 300, such as physical reproduction speed and feature resolution. That is, fewer layers/voxels may allow the model to be reproduced by an additive manufacturing process more quickly, but at the cost of feature resolution. In contrast, more layers/voxels may decrease the size of the features that can be produced (i.e., increase feature resolution), but may decrease the speed at which the model may be physically produced. With this in mind, it is noted that the number of layers/voxels model 300 may be processed into may be practically limited by the minimum feature size, layer thickness, and/or horizontal resolution of the additive deposition process that will be used to produce a physical copy of the model. Accordingly, model 300 may be processed into a number of layers and voxels that provide a desired balance between reproduction speed and feature resolution.

Once a processor has processed model 300 into layers and/or voxels, a controller may cause an additive deposition apparatus to execute an additive deposition process so as to physically reproduce the model. As noted previously in connection with the method of FIG. 2, physical reproduction of the processed model may generally occur from the "bottom up," i.e., from the lower most layer. This concept is generally illustrated in FIGS. 4A-4E, which depicts the layer by layer formation of a physical copy of model 300 by an additive manufacturing apparatus such as 3D printing apparatus 100 of FIG. 1.

Figure 4A:
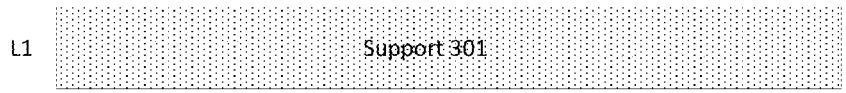
FIGS. 4A-4E illustrate the selective deposition of various materials to form an exemplary thin film field effect transistor.
Figure 4B:
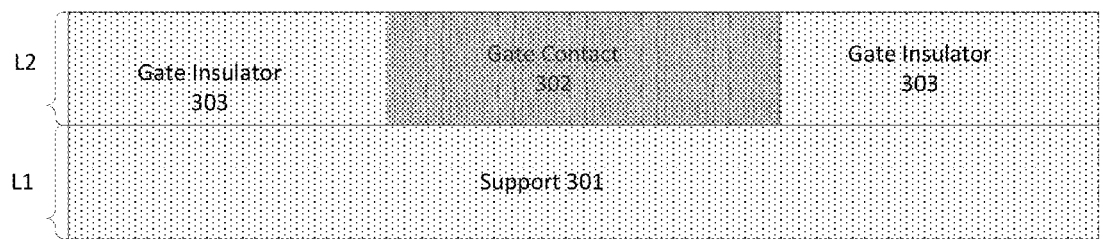

Specifically, a physical copy of model 300 may begin with the deposition of support 301, as shown in FIG. 4A. Without limitation, support 301 may be an organic insulating material, such as those previously described. In some embodiments, support 301 may be formed by forming a layer of organic insulating material (e.g., polyethylene) by fused deposition modeling. Once layer L1 is formed, the process may continue with the formation of layer L2 as shown in FIG. 4B. As show, layer L2 includes two voxels of gate insulator 303 and one voxel of gate contact 302. Such voxels may be simultaneously or sequentially formed by an additive manufacturing process such as fused deposition modeling, selective layer sintering, or a combination thereof. When the voxels are simultaneously formed, materials for each voxel may be concurrently supplied to a deposition mechanism of a print head of a 3D printing apparatus for deposition. When the voxels are formed sequentially, materials for each voxel may be iteratively supplied to a single deposition mechanism of a print head, or to multiple deposition mechanisms within such print head.

Figure 4C:
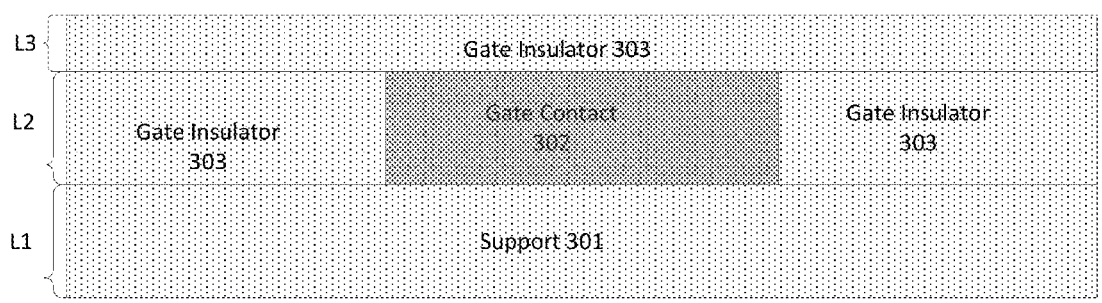
Figure 4D:
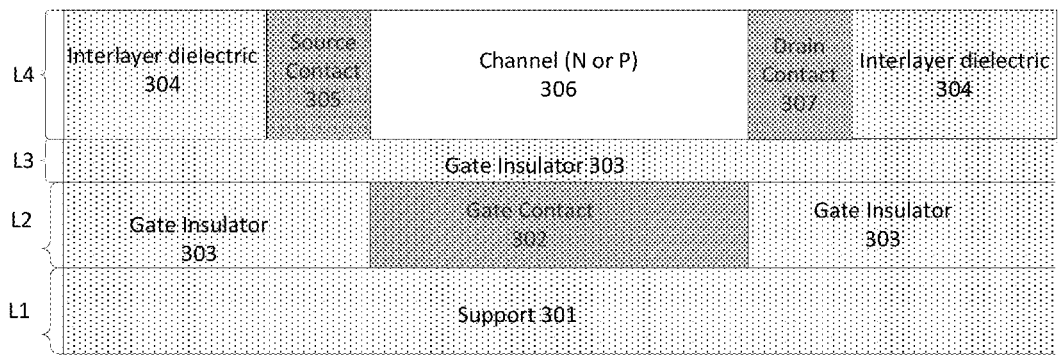
Figure 4E:
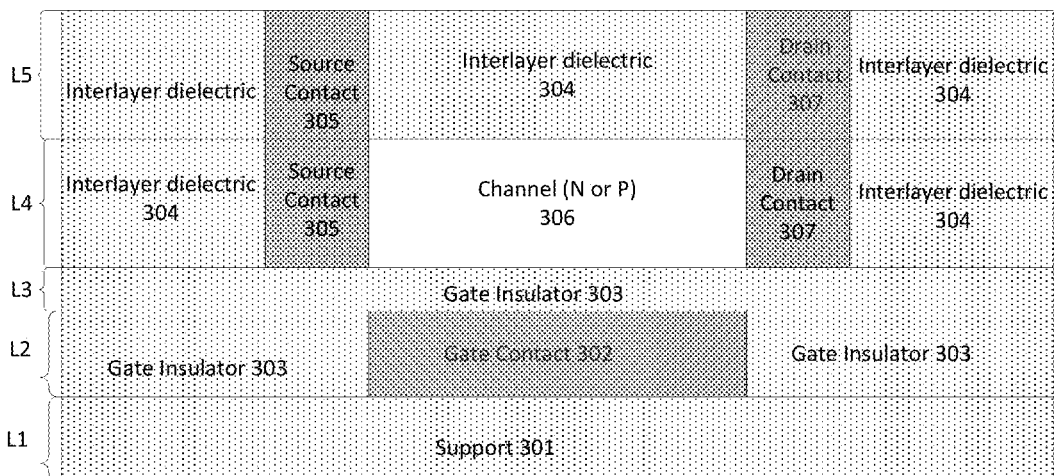

After the formation of layers L1 and L2, the process may iteratively continue so as to form the remaining layers in the processed model 300. This concept is generally shown in FIGS. 4C-4E, which illustrate the successive formation of layers L3, L4, and L5. Ultimately, a physical copy of model 300 is reproduced, as shown in FIG. 4E.

As shown in FIGS. 4A-4E, the systems and methods of the present disclosure may be used to form single electronic components such as FETs via an additive manufacturing process such as 3D printing. While the production of single electronic components may be useful, the systems and methods described herein are not limited to their production. Indeed as noted previously, the systems and methods of the present disclosure may be leveraged to form 3D ICs. Without limitation, the systems and methods described herein may form 3D ICs by additively manufacturing multiple electronic components adjacent to one another, such that they are horizontally and/or vertically integrated.

Figure 5:
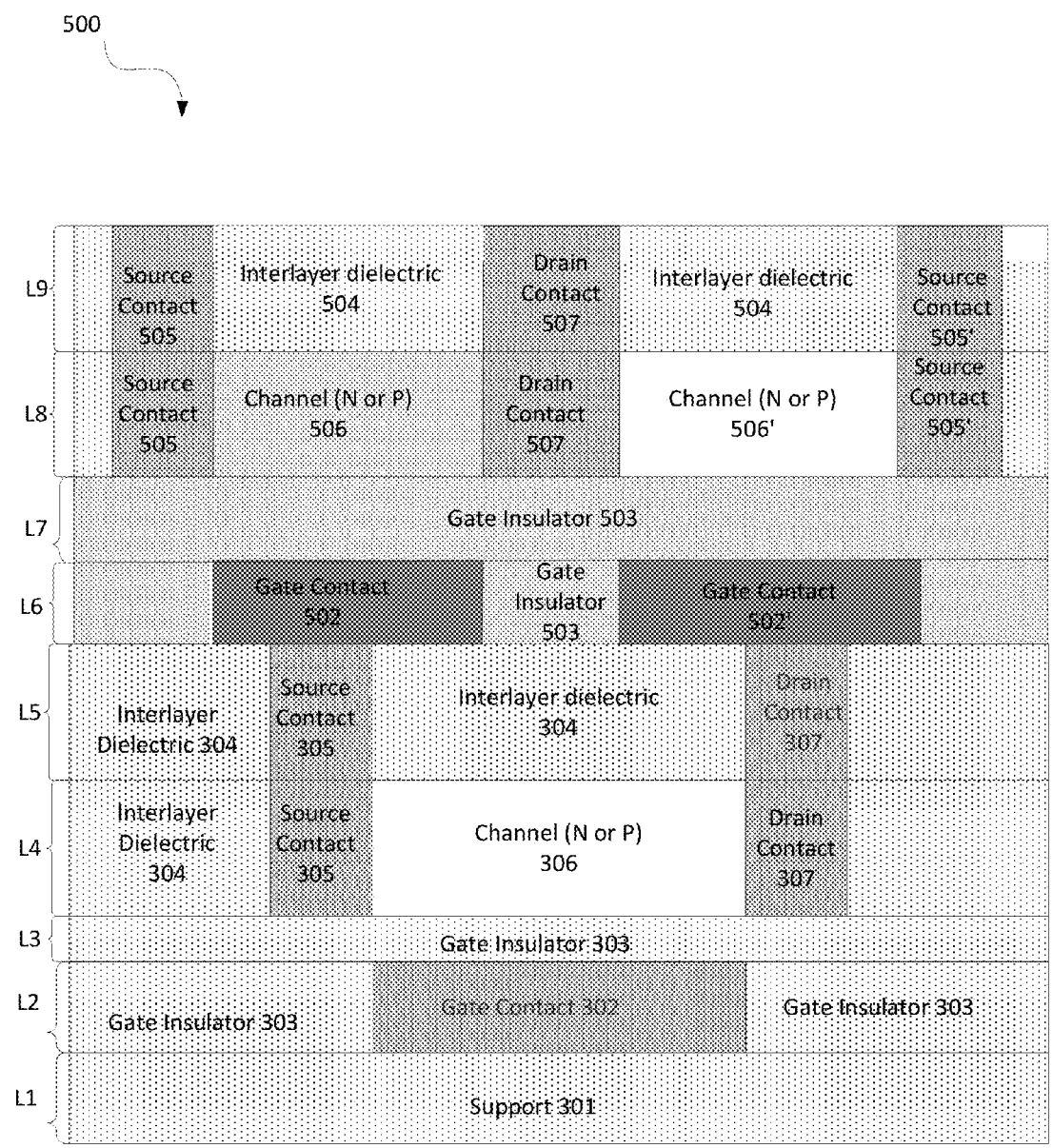
FIG. 5 depicts an exemplary cross-sectional model of a vertically integrated circuit including three exemplary thin film FETs, consistent with the present disclosure.

One aspect of this concept is illustrated in FIG. 5, which illustrates a processed model of an integrated circuit including three vertically integrated thin film FETs, consistent with the present disclosure. Layers L1-L5 of processed model 500 are identical to layers L1-L5 of FIGS. 3B and 4E, and so are not described again. Layers L6-L9 illustrate one exemplary design in which an additional layer of electronic components may be vertically integrated with a first layer of electronic components containing a thin film FET consistent with model 300 using a common drain.

In the illustrated example, processed model 500 includes gate contacts 502, 502', which are formed on source contact 305 and drain contact 307, respectively. Gate contacts 502, 502' are surrounded and spaced apart by gate insulator 503. Source contacts 505, 505' and common drain contact 507 are deposited on an upper surface of gate insulator 503. Semiconductive Channel 506 is disposed between source contact 505 and common drain contact 507, and semiconductive channel 506' is disposed between common drain contact 507 and source contact 505'. Also present is interlayer dielectric 504, which is disposed around and between source contacts 505, 505', channels 506, 506', and common drain 507. Gate contacts 502, 502', gate insulator 503, interlayer dielectric 504, source contacts 505, 505', channels 506, 506', and common drain 507 may be made of the same materials described above for gate contact 302, gate insulator 303, interlayer dielectric 304, source contact 305, channel 306, and drain 307, and thus are not discussed in detail herein.

In addition to supporting vertical integration between layers of electronic components as shown in FIG. 5, the systems and methods of the present disclosure also support horizontal integration of such components. Generally, horizontal integration involves the production of multiple electronic components within the same layer of electronics, such that the electronic components within each layer are electrically connected. For example, horizontal integration may occur by forming multiple thin film FETS (such as the one shown in FIG. 3B) such that they are horizontally spaced from one another, but are electrically connected. The horizontally integrated electronic components may then be vertically integrated with additional electronic components above or below them, as illustrated in FIG. 5.

While this simplified example demonstrates how the systems and methods of the present disclosure may produce electronic components that are horizontally and vertically integrated (i.e., a 3D IC), it should be understood that the manner in which individual electronic components of a device formed by the systems and methods describe herein is not limited to the manner described. Indeed, the manner in which electronic components may be integrated is practically limited only by the creativity of a circuit designer, and the minimum size/thickness/resolution of the layers/features that may be produced by the additive manufacturing equipment.

As noted previously, the systems and methods of the present disclosure are not limited to forming thin film FETs, and may be used to form any desired electronic component. In this regard, reference is made to FIGS. 6 and 7, which depict processed models of two different bipolar junction transistors (BJTs) consistent with the present disclosure. As shown, processed model 600 of FIG. 5 is a cross sectional model of a BJT that includes horizontal contacts, whereas processed model 700 of FIG. 7 is a BJT with vertical contacts.

Figure 6:
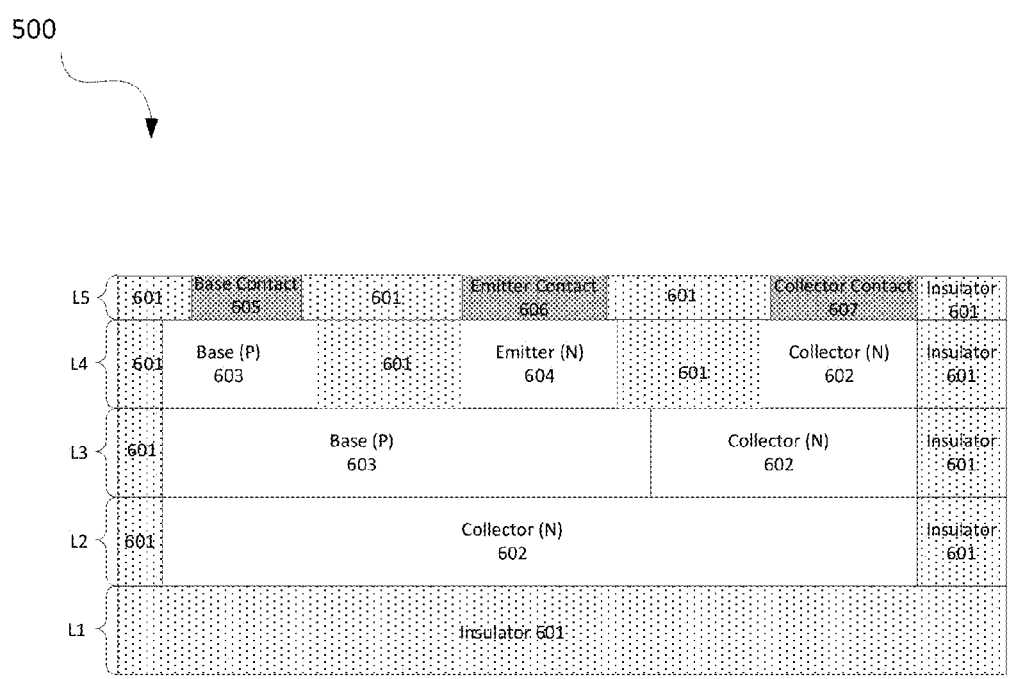
FIG. 6 depicts an exemplary cross-sectional model of a thin film bipolar junction transistor with lateral contacts, in accordance with the present disclosure.
Figure 7:
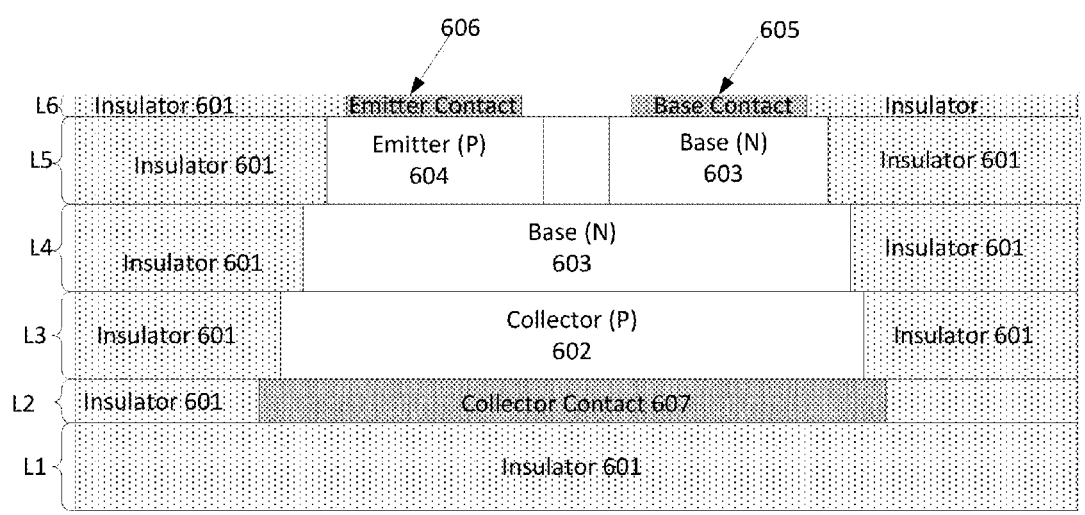
FIG. 7 depicts an exemplary cross-sectional model of a thin film bipolar junction transistor with vertical contacts, consistent with the present disclosure.

With respect to the example of FIG. 6, processed model 600 depicts a NPN bipolar junction transistor that includes insulator 601, collector region 602, base region 603, emitter region 604, base contact 605, emitter contact 606, and collector contact 607. Insulator 601 may be formed of any organic insulating material, such as those previously described. Without limitation insulator 601 is formed from polyethylene. As may be appreciated, the BJT of processed model 600 is configured such that its contacts are oriented horizontally, and thus may facilitate horizontal integration with adjacent BJTs and/or other electronic components.

Collector region 602 may be formed from a p or n type semiconductive organic material, such as those previously described. Without limitation, collector region 602 is preferably formed from p or n doped polyacetylene or p or n doped pentacene. In some embodiments, collector region 602 may be formed of multiple regions of organic semiconductive organic material, wherein each region is contains a different number of excess carriers or acceptors. For example, collector region 602 may include a first layer of semiconductive organic material containing a first level (e.g., 1%) of donors or acceptors, and a second layer of semiconductive organic material with a second level (e.g., 105) of donors or acceptors. Alternatively or additionally, collector region 602 may be formed such that a gradient of donor/acceptor concentration exists between insulator 601 and base region 603, or vice versa. In this non-limiting example, collector region 602 is illustrated as an n-type semiconductive region.

Base region 603 is a semiconductive region that may be formed from p or n type semiconductive organic material, such as those previously described. Without limitation, base region 603 is preferably formed from PTCDI-$C_{13}H_{27}$, an n-type semiconductive organic material. Of course, such material is exemplary only, and base region 603 may be formed from any suitable p or n-type semiconductive organic material, as desired. Like collector region 602, base region may be formed from multiple layers or regions, wherein the concentration of donors and acceptors in each layer/region is the same or different. In some embodiments, base region 603 is formed of multiple layers and/or regions, such that a gradient of donor/acceptor concentration exists between the top and bottom surfaces of base region 603, or vice versa. In the exemplary embodiment of FIG. 6, base region is an n-type organic semiconductor, such as PTCDI-$C_{13}H_{27}$.

Emitter region 604 is a semiconductive region and may be manufactured from a semiconductive organic material, such as those previously described. Accordingly, emitter region may be a p or n type semiconductive organic material. In the illustrated example, emitter region 604 is an n-type organic semiconductor, such as an n-type semiconductive polymer. Without limitation, emitter region 604 is preferably formed from p or n-doped pentacene or polyacetylene.

Base contact 605, emitter contact 606, and collector contact are conductive, and thus may be formed from a conductive material such as those previously described. Without limitation, such components are preferably formed from copper, aluminum, or rubrene.

Processed model 700 of FIG. 7 depicts a BJT that includes the same elements as processed model 600 of FIG. 6, but in a configuration supporting the use of vertical contacts. In this embodiment, collector contact 606 is disposed on insulator 601. Collector region 602 (in this embodiment, a p-type organic semiconductor) is disposed on collector contact 606. Base region 603 (in this embodiment, an n-type organic semiconductor) is disposed on collector region 602. Emitter region 604 (in this embodiment, a p-type semiconductive polymer) is disposed on base region 603. Emitter contact 606 is disposed on emitter region 604, and base contact 605 is disposed on base region 603. As such, processed model 700 depicts a PNP bipolar junction transistor with vertically oriented contacts.

Consistent with the foregoing description, processed models 600, 700 may be physically reproduced with an additive manufacturing process. The manner in which such reproduction may take place is substantially similar as described above for the thin film FET of FIGS. 3A and 3B, and thus will only be described briefly. As shown, processed models 600 and 700 have been processed into a plurality of cross-sectional sections, or layers. Layers including more than one material have been further processed into voxels defining regions of each material. In FIG. 6, processed model 600 has been processed into layers L1-L6, wherein layers L2-L6 contain multiple materials. Processed model 700 of FIG. 7 has been processed into six layers, L1-L6, wherein layers L2-L7 contain multiple materials.

Consistent with the prior description, physical reproductions of processed models 600 and 700 may be produced by an additive manufacturing process from the bottom most layer up. That is, physical reproduction may begin with layer L1, and end with the last layer in the processed model, in these cases layers L5 or L6, respectively. As such, the systems and methods of the present disclosure may produce bipolar junction transistors of varying configurations, which may be incorporated into 3D IC.

Figure 8:
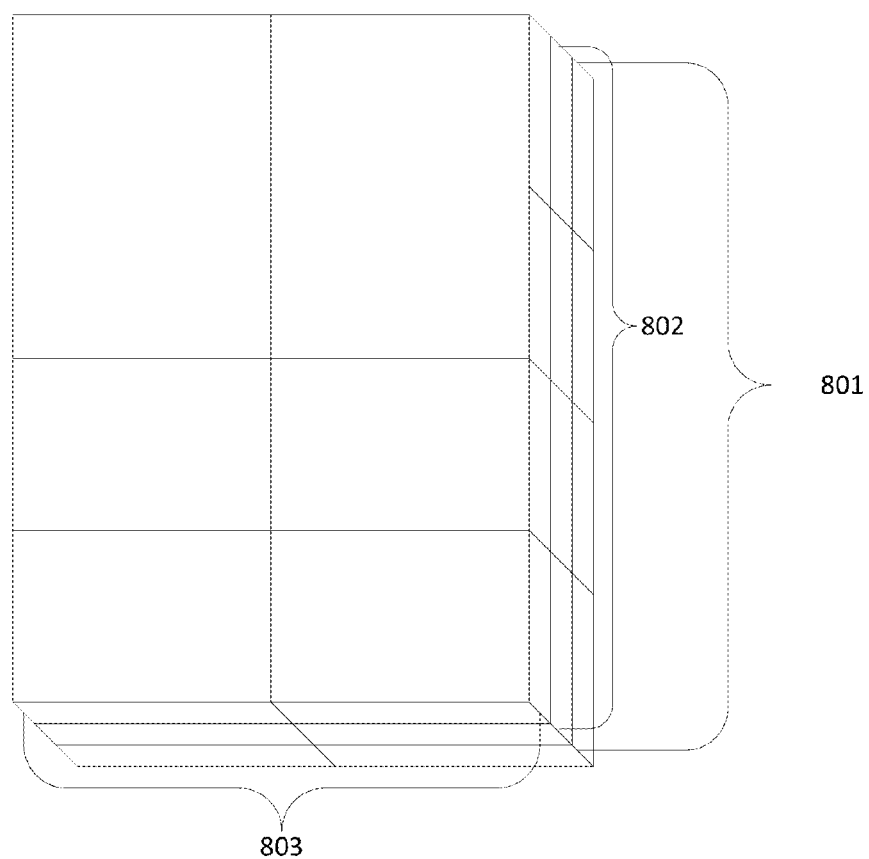
FIG. 8 depicts an exemplary three dimensional integrated circuit including multiple electronic components, consistent with the present disclosure.

As a generic illustration of an exemplary 3D IC structure that may be formed by the systems and methods of the present disclosure, reference is made to FIG. 8. As shown, the systems and methods of the present disclosure may produce a 3D IC including three layers (801, 802, 803) of electronic components. Each layer may include a plurality of electronic components (illustrated as boxes) that may be horizontally and/or vertically integrated with electronic components in an adjacent layer.

It is noted that for the sake of illustration and ease of understanding, FIG. 8 illustrates a 3D IC structure that includes three layers of electronics that each contain eight electronic components. It should be understood that this illustration is exemplary, and that the systems and methods are capable of producing 3D IC's with any desired number of layers. Moreover, each layer may contain any desired number of electronic components. Accordingly, the present disclosure envisions circumstances in which the systems and methods of the present disclosure may be used to form a 3D IC with N layers, wherein N is greater than or equal to 2, such as greater than or equal to 4, 6, 8, 10, 15, 20, 30, 50, 100, 1000 or more. In such embodiments, each of said layers may contain a number of components C, wherein C is greater than or equal to 2, such as greater than or equal to 4, 6, 8, 10, 50, 100, 1000, 10,000, 100,000, 500,000, 1 million, 5 million, 25 million, 50 million, or more.

Accordingly, the systems and methods of the present disclosure may allow for the production of relatively simple to highly complex 3D IC designs, without the need for a semiconductor fabrication facility. Indeed, the systems and methods described herein may permit "on the spot" production of various types of 3D ICs and associated devices. This process may also allow the manufacture of relatively small quantities of electronic components, ICs and 3D ICs (e.g., 1, 10, 100 copies, etc), which might otherwise be expensive or otherwise economically undesirable to produce in a semiconductor fabrication facility. Moreover, the systems may be adapted for use with digital models produced by open source and/or proprietary software, thereby allowing users to produce and share electronic component, circuit, IC, and 3D IC designs, which may be reproduced in a cost effective manner. The systems and methods described herein may also eliminate the need to ship physical systems, and may reduce lead time for such systems substantially, e.g., to minutes, hours, or days.

For example, the systems and methods described herein may be used to fabricate hardware digital keys that may be used in security systems. Depending on the model, such keys may be fabricated using the systems and methods described herein to include extremely long bit sequences that are difficult to hack.

In one embodiment, the systems and methods described herein may be used to produce hardware keys including circuits that contain binary bit sequences recorded as the presence or absence of transistors. Such circuits may be read in the same manner as a conventional read-only memory.

In another embodiment, the systems and methods described herein may be used to produce hardware keys that include logic circuitry that is operable to control access to password sequences, which may or may not be provided in a read-only memory. For example, such circuitry may control or otherwise produce different password sequences based on a system clock and/or time value. This timing element may increase security and hinder attempts (e.g., by a hacker and/or malware) to obtain the password(s).

In yet another embodiment, the systems and methods may be used to produce hardware keys that include circuitry that is operable produce/provide passwords as a logical function of queries. Such logical functions can be programmed, e.g., using programmable logic arrays or field-programmable gate arrays. As such logic functions may be difficult to reproduce by a hacker, such hardware keys may be considered highly secure.

In still other embodiments, the systems and methods described herein may be used to produce hardware keys using an isolated system, i.e., a system that is disconnected from a network such as the internet or an enterprise network, which may enhance security.

In any case, the systems and methods can produce hardware keys that may are disposable and/or designed for a single (one time) use. In such instances, the disposable/one-time use key may be destroyed, particularly when the corresponding security system requires only a response from the hardware key, and not the full information contained in it.

Figure 9:
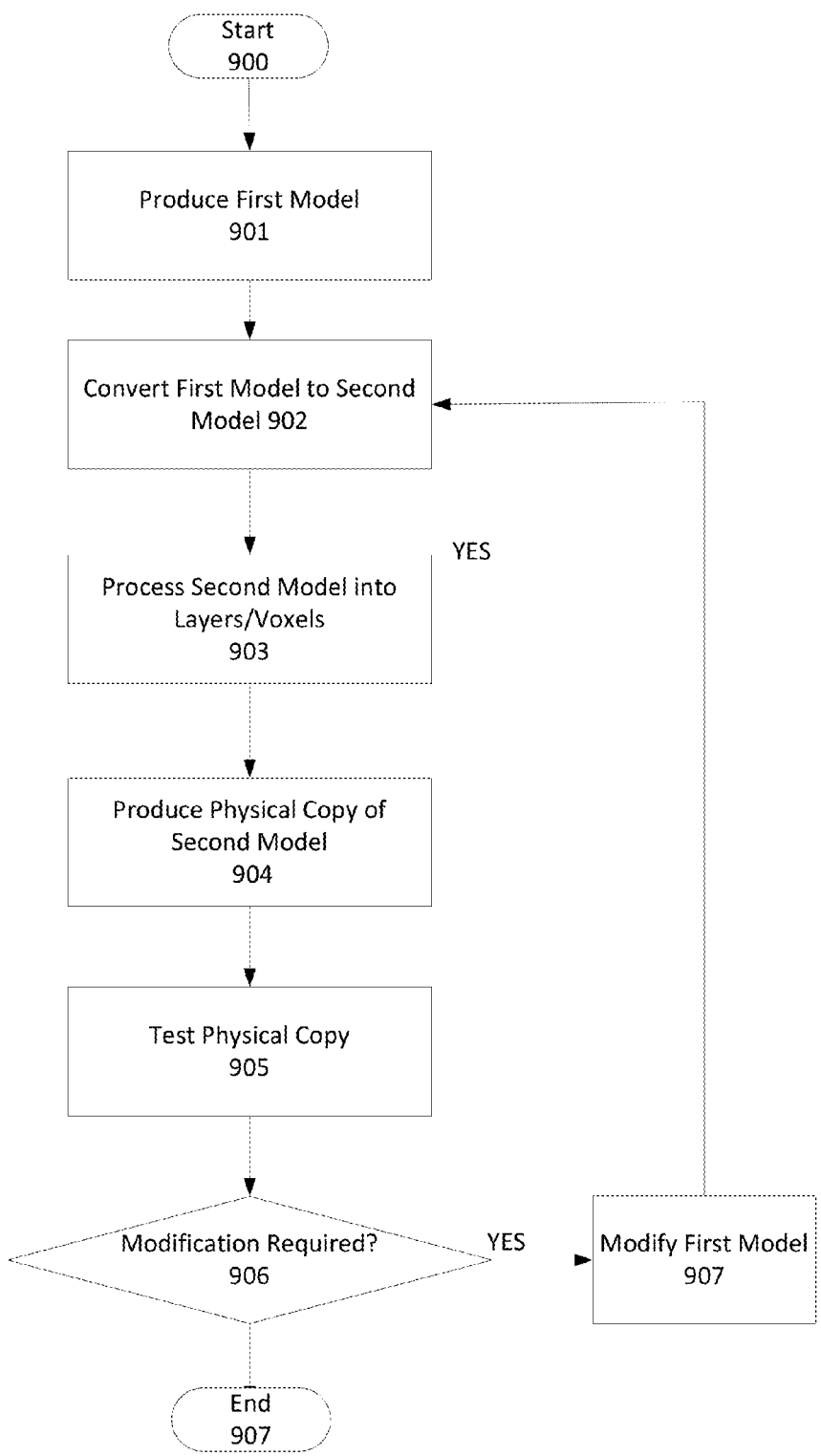
FIG. 9 is a flow chart of another exemplary method of making electronic components and/or 3D ICs consistent with the present disclosure.

Another aspect of the present disclosure relates to methods for testing a 3D IC design. In this regard, reference is made to FIG. 9, which is a flow diagram of an exemplary 3D IC testing method in accordance with the present disclosure. As shown, the method begins at box 900. At block 901, a first digital model ("first model") of an integrated circuit (e.g., a 3D IC) is produced. The first model is designed for production in a semiconductor fabrication facility using traditional inorganic insulating, inorganic semiconductor, and conductive materials such as Si (doped or undoped), SiO, $SiO_2$, and copper.

Once the first model has been provided, the method may proceed to block 902, wherein the first model is converted into a second digital model ("second model"), which is suitable for production using an additive manufacturing process, such as the process described in FIG. 2. Such conversion may be performed by any suitable processor, such as general purpose processor of a computing device (e.g., a desktop computer, a laptop computer, a table computer, a mobile device, etc.). In some embodiments, the conversion of the first model is performed by the host processor in a controller of an additive manufacturing apparatus, such as controller 101 of 3D printing apparatus 100.

In some embodiments, the computing device that converts the first model to the second model may include a host processor and a memory, wherein the memory has 3D IC model conversion instructions (3DMC) instructions stored thereon. In such embodiments, the memory may be any suitable type of computer readable memory. Examples of such memory include but are not limited to: semiconductor firmware memory, programmable memory, non-volatile memory, read only memory, electrically programmable memory, random access memory, flash memory (which may include, for example NAND or NOR type memory structures), magnetic disk memory, optical disk memory, combinations thereof, and the like. Additionally or alternatively, computer readable media may include other and/or later-developed types of computer-readable memory.

The 3DMC instructions when executed by the processor cause the processor to convert the first model to the second model. Without limitation, such conversion may involve correlating traditional inorganic insulating materials and inorganic semiconductor materials in the first model with functionally similar materials that may be selectively deposited using an additive manufacturing process. For example, the 3DMC instructions when executed may cause a processor to associate traditional inorganic materials such as doped or undoped silicon, doped or undoped germanium, etc. with functionally similar organic semiconductor materials, such as those described in table 1. Similar associations may be made between traditional inorganic insulating materials and organic insulating materials that may be selectively deposited. In some embodiments, such associations may be stored in a database that is local to the processor performing the conversion, or remote to such processor (e.g., on an enterprise or internet/cloud server).

Once the first model has been converted to the second model, the process may advance to block 903, wherein the second model is processed into layers and/or voxels. This processing is substantially the same as that described above for block 201 of FIG. 2, and so is not repeated here. The method may then advance to block 904, wherein a physical copy of the second model is produced using an additive manufacturing process. This may occur in substantially the same manner as described above for blocks 302 to 305 of FIG. 2, and so is not discussed herein. The result of block 904 is the production of a first physical copy of the second model of the 3D IC.

At block 905, one or more characteristics of the first physical copy of the second model may be tested. Such testing may include for example inputting various test patterns to the inputs of the physical copy and monitoring the outputs. Such testing may verify the correct logical connectivity and functionality of various circuits of the chip, the presence/absence of errors related to power or ground routing, the timing of signal flow through critical paths, clock timing, combinations thereof, and other characteristics of the chip.

The method may then proceed to block 906, whereupon a determination is made as to whether an adjustment to first model of the 3D IC is required. If adjustments are required, the method may proceed to block 907, whereupon adjustments to the first model are made, thereby creating a modified first digital model ("modified first model"). The method may then proceed back to block 902, wherein the modified first model is converted to a modified second digital model ("modified second model"), and the method proceeds as previously stated. If and when no further adjustments to the first model (or a subsequent first modified model) are required, the method may proceed to block 908, whereupon the method ends.

While the foregoing description has focused on the production of integrated circuits "from the ground up" on a generic platform or other support, the systems and methods described are not limited in this respect. Indeed, the systems and methods of the present disclosure may be used to deposit/form one or more layers of electronics upon a substrate or support that already includes one or more layers of circuitry/electronic components. In such instances, the substrates/supports may be include circuits/components formed from/in inorganic semiconductors, e.g., as used in traditional electronics manufacturing. Alternatively or additionally, the substrates/supports may include circuits/components formed from/in organic semiconductors, such as those described herein.

Another example method includes any or all of the foregoing components, wherein the integrated circuit includes a plurality of (i.e., multiple) layers of electronic components.

Another example method includes any or all of the foregoing components, wherein the integrated circuit is a three dimensional integrated circuit.

Accordingly, one aspect of the present disclosure relates to a method for producing integrated circuits. Such method may include processing with a host processor of a computing device a digital model of an integrated circuit into a plurality of layers, and iteratively forming the plurality of layers on a support with an additive manufacturing apparatus so as to produce an operable physical copy of said digital model. The integrated circuit may include at least one electronic component comprising at least one semiconductive region. The at least one semiconductive region may be reproduced in said physical copy with at least one semiconductive organic material. As may be appreciated, such method may be used to produce two or three dimensional integrated circuits, as well as multiple layers of circuitry that are not vertically integrated with one another.

Another example method includes any or all of the foregoing elements, wherein the additive manufacturing apparatus includes at least one print head that includes at least one deposition mechanism and at least one curing mechanism.

Another example method includes any or all of the foregoing elements, wherein the additive manufacturing apparatus is configured to iteratively deposit the plurality of layers by at least one of fused deposition modeling, stereolithography, and granular materials binding.

Another example method includes any or all of the foregoing elements wherein the digital model of the integrated circuit comprises a plurality of electronic components comprising at least one semiconductive region; and the at least one semiconductive region is reproduced in the physical copy of the digital model with the at least one semiconductive organic material.

Another example method includes any or all of the foregoing elements wherein: the digital model of the plurality of electronic components further comprise at least one electrically insulating region and at least one electrically conductive region; and the at least one electrically insulating region and the at least one electrically conductive region are reproduced in the physical copy of the digital model with at least one organic insulating material and at least one conductive material, respectively.

Another example method includes any or all of the foregoing elements, wherein the at least one semiconductive organic material is selected from the group consisting of pentacene, rubrene, hexadecafluorocopperphthalocyanine, perylene-tetracarboxylic dianhydride, napthalene-tetracarboxylic dianhydride, copper phthalocyanine, α-sexithiophene, 6,13-Bis (tri-isopropylsilylethynyl) pentacene, N,N'-ditridecylperylene-3,4,9,10-tetracarboxylic diimide, 4,4'-bis[N-(1-napthyl)-N-phenyl-amino]-biphenyl, α-napthylphenylbiphenyl diamine, p-doped polyacetylene, n-doped polyecetylene, and combinations thereof.

Another example method includes any or all of the foregoing elements, wherein the at least one organic insulating material is polyethylene.

Another example method includes any or all of the foregoing elements, wherein the at least conductive material is selected from the group consisting of copper, aluminum, gold, rubrene, and combinations thereof.

Another example method includes any or all of the foregoing elements, wherein when a layer of the plurality of layers comprises multiple materials, the method further includes processing said layer of said plurality of layers with the host processor into a plurality of voxels, wherein each of the plurality of voxels define a region of one of the multiple materials.

Another example method includes any or all of the foregoing components, wherein the integrated circuit includes a plurality of (i.e., multiple) layers of electronic components.

Another example method includes any or all of the foregoing components, wherein the integrated circuit is a three dimensional integrated circuit.

Another aspect of the present disclosure is a three dimensional printing apparatus that includes a controller, a print head and a materials store. The controller is configured to process a digital model of an integrated circuit into a plurality of layers with a host processor. In such embodiments, the integrated circuit includes at least one electronic component comprising at least one semiconductive region; and the print head is configured to produce an operable physical copy of the three dimensional integrated circuit by iteratively depositing on a support each of the plurality of layers using one or more materials contained in the materials store.

Another exemplary apparatus includes any or all of the foregoing components, wherein the print head comprises at least one deposition mechanism and at least one curing mechanism, wherein the deposition mechanism is configured to produce layers of uncured materials from said materials store on said support, and the curing mechanism is configured to cure the layers of uncured materials.

Another exemplary apparatus includes any or all of the foregoing components, wherein the deposition mechanism produces said layers of uncured materials by at least one of: extruding a molten extrudate of a material in the materials store on the support; depositing particles of a material in the materials store on said support; and forming a layer of photopolymerizable material from said materials store on the support.

Another exemplary apparatus includes any or all of the foregoing components wherein the curing mechanism cures the layers of uncured materials by applying at least one of light and heat to the layers.

Another exemplary apparatus includes any or all of the foregoing components wherein the print head comprises a plurality of nozzles.

Another exemplary apparatus includes any or all of the foregoing components, wherein the materials store contains at least one semiconductive organic material, and the print head is configured to physically reproduce the at least one semiconductive region with the at least one semiconductive organic material.

Another exemplary apparatus includes any or all of the foregoing components, wherein the digital model further comprises an electrically insulating region and an electrically conductive region, the materials store contains at least one organic insulating material and at least one conductive material, and the print head is configured to physically reproduce the electrically insulating region and electrically conductive regions with the at least one organic insulating material and at least one conductive material, respectively.

Another example apparatus includes any or all of the foregoing components, wherein the integrated circuit includes a plurality of (i.e., multiple) layers of electronic components.

Another example apparatus includes any or all of the foregoing components, wherein the integrated circuit is a three dimensional integrated circuit.

Another aspect of the present disclosure relates to a three dimensional integrated circuit that includes a plurality of electronic components, wherein at least one of the plurality of electronic components comprises a semiconductive region formed from at least one semiconductive organic material.

Another exemplary three dimensional integrated circuit includes any or all of the foregoing components wherein the semiconductive organic material is selected from the group consisting of pentacene, rubrene, hexadecafluorocopperphthalocyanine, perylene-tetracarboxylic dianhydride, napthalene-tetracarboxylic dianhydride, copper phthalocyanine, α-sexithiophene, 6,13-Bis(tri-isopropylsilylethynyl) pentacene, N, N'-ditridecylperylene-3,4,9,10-tetracarboxylic diimide, 4,4'-bis[N-(1-napthyl)-n-phenyl-amino]-biphenyl, α-napthylphenylbiphenyl diamine, p-doped polyacetylene, n-doped polyacetylene, and combinations thereof.

Another exemplary three dimensional integrated circuit includes any or all of the foregoing components, wherein the at least one of the plurality of electronic components further includes an electrically insulating region formed from at least one organic insulating material.

Another exemplary three dimensional integrated circuit includes any or all of the foregoing components, wherein the organic insulating material is polyethylene.

Another exemplary three dimensional integrated circuit includes any or all of the foregoing components, wherein the at least one of the plurality of electronic components further includes a conductive region formed from a conductive material.

Another exemplary three dimensional integrated circuit includes any or all of the foregoing components, wherein the conductive material is selected from copper, gold, aluminum, rubrene, and combinations thereof.

Another exemplary three dimensional integrated circuit includes any or all of the foregoing components, wherein the at least one of the plurality of electronic components is an active electronic component or a passive electronic component.

Another exemplary three dimensional integrated circuit includes any or all of the foregoing components, wherein the at least one of the plurality of electronic components is a transistor, a diode, or an optoelectronic device.

Another exemplary three dimensional integrated circuit includes any or all of the foregoing components, wherein the semiconductive region includes a gate, a channel, a source, a drain, a base, an emitter, a collector, or a combination thereof.

Another aspect of the present disclosure related to a method for testing an integrated circuit. The method includes converting with a host processor of a computing device a first digital model of the integrated circuit to a second digital model of the integrated circuit, wherein: the integrated circuit includes a plurality of electronic components that comprise one or more semiconductive regions; the first model designates the use of one or more inorganic materials for the semiconductive regions; and the second digital model designates the use of one or more semiconductive organic materials for the semiconductive regions.

Another exemplary method includes any or all of the foregoing components, wherein: the plurality of electronic components further include one or more electrically insulating regions; the first digital model designates the use of one or more inorganic insulating materials for the electrically insulating regions; and the second digital model designates the use of one or more organic insulating materials for the electrically insulating regions.

Another exemplary method includes any or all of the foregoing components, and further includes producing an operable physical copy of the second digital model using an additive manufacturing apparatus.

Another exemplary method includes any or all of the foregoing components, wherein producing the operable physical copy includes: processing the second digital model of the integrated circuit with said host processor into a plurality of layers; and iteratively forming the plurality of layers on a support with the additive manufacturing apparatus so as to produce an operable physical copy of said second digital model; wherein the semiconductive regions in the second digital model are reproduced in the physical copy using said one or more semiconductive organic materials.

Another exemplary method includes any or all of the foregoing components, wherein: the first digital model designates the use of one or more inorganic insulating materials for the electrically insulating regions; the second model designates the use of one or more organic insulating materials for the electrically insulating regions; and the electrically insulating regions are reproduced in the physical copy using the one or more organic insulating materials.

Another exemplary method includes any or all of the foregoing components, and further includes testing at least one parameter of the physical copy.

Another exemplary method includes any or all of the foregoing components, and further includes modifying at least one of the first and second models based on the testing, thereby producing a modified first model, a modified second model, or a combination thereof.

Another exemplary method includes any or all of the foregoing components, and further includes producing a modified physical copy of the three dimensional integrated circuit based on the modified first model, modified second model, or a combination thereof.

Another exemplary method includes any or all of the foregoing components, wherein the integrated circuit includes a plurality of (i.e., multiple) layers of electronic components.

Another exemplary method includes any or all of the foregoing components, wherein the integrated circuit is a three dimensional integrated circuit.

Another aspect of the present disclosure related to a computer readable medium. In one example, the computer readable medium has three dimensional model conversion (3DMC) instructions stored thereon. The 3DMC instructions when executed by a processor cause the processor to perform the following operations comprising: converting a first digital model of a integrated circuit to a second digital model of the three dimensional integrated circuit, wherein: the integrated circuit includes a plurality of electronic components that include one or more semiconductive regions; the first model designates the use of one or more semiconductive inorganic materials for said semiconductive regions; and
the second digital model designates the use of one or more semiconductive organic materials for the semiconductive regions.

Another exemplary computer readable medium includes any or all of the foregoing elements, wherein said 3DMC instructions when executed further cause the processor, during said converting, to: associate the inorganic semiconductive materials designated by the first digital model with one or more organic semiconductive materials; and designate the organic semiconductive materials for use in corresponding semiconductive regions in the second model.

Another exemplary computer readable medium includes any or all of the foregoing elements, wherein the 3DMC instructions when executed further cause said processor to: process the second digital model into a plurality of layers; and output a signal to an additive manufacturing apparatus, wherein the signal is configured to cause the additive manufacturing apparatus to produce an operable physical copy of the second digital model.

Another exemplary computer readable medium includes any or all of the foregoing elements, wherein the signal is configured to cause said additive manufacturing apparatus to iteratively form the plurality of layers on a support, such that the one or more semiconductive regions in the second digital model are reproduced in the physical copy using the one or more semiconductive organic materials.

Another exemplary computer readable medium includes any or all of the foregoing elements, wherein the 3DMC instructions when executed further cause the processor, during said converting, to: associate inorganic insulating materials designated by the first digital model for use in one or more electrically insulating regions of the three dimensional integrated circuit with one or more organic insulating materials; and designate the organic insulating materials for use in corresponding electrically insulating regions of the second model.

Another exemplary computer readable medium includes any or all of the foregoing elements, wherein the signal causes the additive manufacturing system to produce the one or more electrically insulating regions in the physical copy with the one or more organic insulating materials.

Another exemplary computer readable medium includes any or all of the foregoing components, wherein the integrated circuit includes a plurality of (i.e., multiple) layers of electronic components.

Another exemplary computer readable medium includes any or all of the foregoing components, wherein the integrated circuit is a three dimensional integrated circuit.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A three dimensional printing apparatus, comprising:
a controller;
a print head; and
a materials store; wherein:
said controller is configured to process a digital model of an integrated circuit into a plurality of layers with a host processor;
said integrated circuit includes at least one electronic component comprising at least one semiconductive region; and
said print head is configured to produce an operable physical copy of said integrated circuit by iteratively depositing on a support each of said plurality of layers using one or more materials contained in said materials store.

2. The three dimensional printing apparatus of claim 1, wherein said print head comprises at least one deposition mechanism and at least one curing mechanism, wherein said deposition mechanism is configured to produce layers of uncured material from said materials store on said support, and said curing mechanism is configured to cure said layers of uncured material.

3. The three dimensional printing apparatus of claim 2, wherein said deposition mechanism produces said layers of uncured material by at least one of:
extruding a molten extrudate of a material in said materials store on said support;
depositing particles of a material in said materials store on said support; and
forming a layer of photopolymerizable material from said materials store on said support.

4. The three dimensional printing apparatus of claim 3, wherein said curing mechanism cures said layers of uncured material by applying at least one of light and heat to said layers.

5. The three dimensional printing apparatus of claim 1, wherein said print head comprises a plurality of nozzles.

6. The three dimensional printing apparatus of claim 1, wherein said materials store contains at least one semiconductive organic material, and said print head is configured to physically reproduce said at least one semiconductive region with said at least one semiconductive organic material.

7. The three dimensional printing apparatus of claim 6, wherein said digital model further comprises an electrically insulating region and an electrically conductive region, said materials store contains at least one organic insulating material and at least one conductive material, and said print head is configured to physically reproduce said electrically insulating region and electrically conductive region with said at least one organic insulating material and at least one conductive material, respectively.

8. The three dimensional printing apparatus of claim 1, wherein said integrated circuit comprises multiple layers of electronic components.

9. The three dimensional printing apparatus of claim 1, wherein said integrated circuit is a three dimensional integrated circuit.

* * * * *